United States Patent [19]

Pankratz

[11] Patent Number: 5,135,836
[45] Date of Patent: Aug. 4, 1992

[54] POLYOLEFIN BACKSIDE COATING FOR PHOTOSENSITIVE REPRODUCTION ELEMENT

[75] Inventor: Richard P. Pankratz, Circleville, Ohio

[73] Assignee: E. I. du Pont de Nemours and Company, Wilmington, Del.

[21] Appl. No.: 763,048

[22] Filed: Sep. 20, 1991

Related U.S. Application Data

[63] Continuation-in-part of Ser. No. 492,966, Mar. 13, 1990, abandoned.

[51] Int. Cl.$^5$ .................................................. G03F 7/11
[52] U.S. Cl. .................................... 430/259; 430/260; 430/273; 430/961

[58] Field of Search ................ 430/260, 259, 273, 961

[56] References Cited

U.S. PATENT DOCUMENTS

| 4,191,572 | 3/1980 | Cohen et al. | 430/260 |
| 4,403,030 | 9/1983 | Miura et al. | 430/961 X |
| 4,489,154 | 12/1984 | Taylor, Jr. | 430/253 |
| 4,634,658 | 1/1987 | Johnson et al. | 430/260 X |
| 4,885,225 | 12/1989 | Heller et al. | 430/961 X |
| 4,902,594 | 2/1990 | Platzer | 430/961 X |
| 5,035,981 | 7/1991 | Kurtz et al. | 430/259 X |

Primary Examiner—Cynthia Hamilton

[57] ABSTRACT

A polyolefin coating provides slip and antiblock properties to a multilayer, peel-apart photosensitive element.

9 Claims, No Drawings

POLYOLEFIN BACKSIDE COATING FOR PHOTOSENSITIVE REPRODUCTION ELEMENT

This application is a continuation-in-part of U.S. Ser. No. 07/492,966, filed Mar. 13, 1990 now abandoned.

FIELD OF THE INVENTION

This invention relates to a polyolefin backside coating for providing slip and antiblock properties to a multilayer, peel-apart photosensitive element comprising a strippable coversheet, a photohardenable layer, an elastomeric layer and a support. An oxyethylene homopolymer photorelease layer can be included in the multilayer element to reverse the adhesion properties between the coversheet and the photohardenable layer.

BACKGROUND OF THE INVENTION

Photosensitive elements which can be used in image-reproduction processes are well-known in the graphics arts industry. Such elements are exposed to actinic radiation through an image-bearing transparency, such as a color separation transparency, and developed to produce an image which is either positive or negative with respect to the transparency used. Positive-working elements produce an image which is a duplicate of the transparency through which they are exposed. Negative-working elements produce an image that is the reverse of the transparency through which they are exposed. After imagewise exposure, the photosensitive elements are developed by washout of soluble image areas, toning tacky image areas with a colorant, peeling apart photoadherent layers, or combinations of these techniques. A series of such images may be combined to form a color proof.

U.S. Pat. No. 4,489,154 issued to Taylor on Dec. 18, 1984, discloses a dry process for preparing a surprint proof using an imagewise exposed, peel-apart photosensitive element comprising a strippable coversheet; a photoadherant layer containing a colorant; a tacky non-photosensitive elastomeric layer; and a support. After exposure to actinic radiation through a positive image, e.g. a positive separation transparency, and peeling off the coversheet, a positive colored, photoadherent image remains on the supported elastomeric layer. This image is then adhered to a substrate. By repeating this process with different colored photoadherent layers, a multicolored surprint proof can be built up on the substrate. If exposure is through a negative image, e.g. a negative separation transparency, a positive image is obtained on the coversheet.

Coassigned U.S. patent application Ser. No. 07/357,849 filed on May 30, 1989, discloses a multilayer, peel-apart photosensitive element comprising in sequence a strippable coversheet; and oxyethylene homopolymer photorelease layer; a photohardenable layer, optionally containing a colorant; a tacky nonphotosensitive elastomeric layer; and a support. The photorelease layer reverses the adhesive relationship of the coversheet and the photohardenable layer as previously described by Taylor. After exposure to actinic radiation, and peeling off the coversheet, the unexposed areas of the photosensitive layer adhere more strongly to the coversheet than to the elastomeric layer so that the unexposed, unhardened areas are removed with the coversheet and the exposed, hardened areas remain on the elastomeric layer. If the photosensitive layer contains a colorant, exposure through a positive separation transparency produces a positive, colored image directly on the coversheet. A plurality of such coversheets bearing different colored images can be stacked in register to form a multicolored positive overlay proof. The photosensitive elements are preferably colored yellow, magenta, cyan and black. Such precolored elements can also be used to prepare negative-working multicolor surprint proofs without the use of toners or the additional complications of using an image transfer step or the addition of an adhesive layer.

During stacking of the different colored images, the unphotopolymerized polymer of one color is placed in contact with the coversheet for the next color. The photopolymer tends to stick (or block) to the adjacent coversheet and when the coversheets are separated, the photopolymer image can be ruined. Moreover, the image bearing coversheets have poor slip properties which causes difficulties in obtaining proper registration during formation of the multicolor overlay proof.

In accordance with this invention, it has been found that multilayer, peel-apart photosensitive elements having the requisite slip and antiblocking properties can be obtained by coating the backside of the coversheet of said photosensitive element with a polyolefin coating.

SUMMARY OF THE INVENTION

The present invention provides a multilayer, peel-apart photosensitive element comprising, in sequence:
(1) a strippable coversheet, transparent to actinic radiation, and coated on a surface with a layer of a cross-linked polyolefin homopolymer, cross-linked polyolefin homopolymer which has been oxidatively modified to introduce acid groups, or cross-linked polyolefin copolymer formed by copolymerization of a polyolefin with up to 5 weight % of a copolymerizable monomer, wherein the coated surface does not face a photohardenable layer of (2)
(2) a photohardenable layer,
(3) a non-photosensitive elastomeric layer; and
(4) a support sheet.

Optionally a photorelease layer is present intermediate (1) and (2) and comprises a solid, oxyethylene homopolymer photorelease agent of the formula, $H(OCH_2CH_2)nOH$, with a molecular weight greater than 3,000.

DETAILED DESCRIPTION OF THE INVENTION

The invention relates to multilayer, peel-apart photosensitive elements of the type described in U.S. Pat. No. 4,489,154 and coassigned U.S. patent application Ser. No. 357,849 described hereinbefore and additionally containing a backside coating layer of a cross-linked polyolefin homopolymer or copolymer for providing slip and antiblocking properties as described hereinbelow. The disclosures of both the U.S. patent and U.S. patent application are herein incorporated by reference.

The coversheet of the element must be strippable (i.e. removable by peeling it apart) from the rest of the element, oxygen impermeable and transparent to actinic radiation so that the element may be exposed through the coversheet. Preferred materials for the coversheet are polymeric films, particularly polyester films such as polyethylene terephthalate. The surface of the coversheet may also be treated such as by electrical discharge or flame treatment to improve adhesion to the exposed areas of the photohardenable layer.

The cross-linkable polyolefin is applied to the backside of the coversheet of the photosensitive element, i.e. to the side opposite the photohardenable layer, in the form of an aqueous emulsion using know coating techniques, e.g. by dip coating, reverse roller coating or slot die coating. The coating can be applied to cast polyester film and subsequently biaxially stretched or to one way stretched polyester film and subsequently monoaxially stretched in the same or a different direction. The film may be stretched at any draw ratio commonly employed in the production of polyester film, generally up to 4.5 times in each direction. Convenient draw ratios are about 3.6 times in each direction. The coated film is then heat set at 210° C. to cross-link the coating. The final dry coating weight is preferably within the range of 0.01 to 2 mg/dm2, most preferably within the range of 0.1 to 0.3 mg/dm2, and the coating thickness is preferably about 200 angstroms.

The cross-linkable polyolefins used in this invention are derived from the polymerization of unsaturated aliphatic hydrocarbons such as ethylene, propylene, butene, pentene, hexene, butadiene, hexadiene, etc. containing active hydrogen groups which provide sites for subsequent cross-linking. Particularly preferred polyolefins are polyethylene and polypropylene. Operable cross-linkable polyolefins also include homopolymers such as polyethylene and polypropylene which have been subsequently oxidatively modified to introduce acid groups and polyolefin copolymers such as ethylene or propylene containing up to 5 weight % of a copolymerizable monomer such as acrylic or methacrylic acid or their esters containing functional groups, including hydroxy, carboxyl, amide and oxirane groups. The cross-linkable polyolefin polymers preferably have a molecular weight of at least 2000 and an acid number ranging from 10 to 50.

The coating composition also includes a cross-linking agent such as the condensation product of an amine, such as melamine, urea and diazines or their derivatives, with formaldehyde which may be alkylated. A cross-linking catalyst, e.g. ammonium sulfate, is also provided to cross-link the polyolefin.

Therefore the coating composition on crosslinking results in a cross-linked polyolefin homopolymer, cross-linked polyolefin homopolymer which has been oxidatively modified to introduce acid or polyolefin copolymer formed by copolymerization of a polyolefin with up to 5 weight % of a copolymerizable monomer.

The coating composition applied to the coversheet may also include antioxidants, lubricants, surfactants etc. as long as they do not interfere with the effect of imparting slip and antiblocking properties characteristic of this invention.

The photohardenable layer is subsequently coated from an appropriate solvent onto the opposite side of the cross-linked polyolefin coated polyester coversheet as described in U.S. Pat. No. 4,489,154. Alternatively, the photohardenable layer can be applied over an oxyethylene homopolymer photorelease layer as described in coassigned U.S. patent application Ser. No. 357,849. The elastomeric layer is coated onto the support and, after evaporation of the solvent, the supported elastomeric layer is laminated to the photohardenable layer to produce a multilayer, peel-apart photosensitive element comprising in sequence: the cross-linked polyolefin coated polyester coversheet; the photorelease layer, if present; the photohardenable layer; the elastomeric layer; and the support. Further details of the formation of the multilayer photosensitive elements are described in the aforesaid U.S. patent and U.S. patent application.

The advantageous properties of this invention can be observed by reference to the following examples which illustrate, but do not limit, the invention. All parts and percentages are by weight unless otherwise indicated.

EXAMPLES

| GLOSSARY | |
|---|---|
| Cymel ® 301 | hexamethoxy melamine formaldehyde resin made by American Cyanamid, Wayne, N.J. |
| Duponol ® WAQE | 30% aqueous solution of sodium auryl sulfate made by Du Pont, Wilmington, DE. |
| E-535 | 50% solution in alcohol of a 50/50 vinylpyrrolidone/vinyl acetate made by GAF, New York, N.Y. |
| Aerosol ® OT-75 | a 75% active solution of the sodium salt of dioctyl sulfosuccinate made by American Cyanamid. |
| Valsof ® PE 26 | 26% solids emulsion made by Valchem Polymers, Langley, S.C. Emulsion contains 20% Epolene ® E-10 polyethylene. Epolene ® E-10 is made by Eastman Chemical Products, Kingsport, TN. and is a polyethylene of density: 0.942, acid number: 15 and molecular weight: 3000. |
| Michel ® 43043 | a 40% solids emulsion of polypropylene (Epolene ® E-43) made by Michelman Chemicals, Cincinnati, Ohio. Epolene ® E-43 is made by Eastman Chemical Products and is a polypropylene of density: 0.934, acid number: 47 and molecular weight: 4500. |
| Chemcor ® 2-67A | a 25% solids emulsion of a polyethylene with a bisamide made by Chemical Corporation of America, East Rutherford, N.J. The polyethylene is made by American Hoescht, Sommerville, N.J. and has a density: 0.98, acid number: 25 and molecular weight: 1500. |
| Chemcor ® 316N30 | a 30% solids emulsion of polyethylene made by Chemical Corporation of America using an Allied Chemical (Morristown, N.J.) oxidized polyethylene has a density: 0.98, acid number: 16 and melt viscosity (149° C.) of 30,000 (Brookfield). |

The cross-linkable polyolefin coatings were prepared from commercially available aqueous polyolefin emulsions which were further formulated with surfactants and curing agents. The acid numbers and molecular weights of the acid-modified polyolefins are those supplied by the manufacturer.

EXAMPLES 1 TO 4

1. An aqueous polyethylene emulsion was prepared from
692 g Valsof ® PE26
13.5 g Cymel ® 301
12 g Duponol WAQE
4.35 g E-535
1.2 g Aerosol ® OT-75
22.3 g Isopropyl alcohol
0.675 g Ammonium sulfate
3 ml. Conc. Ammonium hydroxide and distilled water to 3600 g.

The coating was applied to one side of a cast polyester film by roller coating. The cast film was corona treated prior to coating to improve surface adhesion. The coating was dried at 70° C. for 4 seconds and the coated film was sequentially biaxially stretched using a stretch ratio of 3.6×3.6. The film was heat set at 210° C. The final coating thickness was 200 mm.

2. Example 1 was repeated except that 410 g of Michem ® 43043 was used in place of 692 g of Valsof ® PE26 and all other ingredients were scaled up to 91.1% to provide 3280 g of final coating.

3. Example 1 was repeated except that 600 g of Chemcor ® 2-67A was used in place of 692 g Valsof ® PE26.

4. Example 1 was repeated except that 720 g of Chemcor ® 316N30 was used in place of 692 g of Valsof ® PE26.

Examples 1 to 4 were evaluated for antiblocking and slip properties against an uncoated polyester control film.

Blocking Test: Photopolymer—Each coated sample was placed against a black unphotopolymerized polymer film under 5 psi for 24 hours at 53° C. After cooling, the structure was peeled apart and evaluated.

Polyethylene Oxide—Each sample was placed against a polyethylene oxide coated Mylar ® polyester film (which had a coating weight of 0.08 gm/m2) under 5 psi for 24 hours at 53° C. After cooling, the structure was peeled apart and evaluated.

BLOCKING TESTS

| Example | Photopolymer | Polyethylene Oxide |
|---|---|---|
| 1 | 1 | 0 |
| 2 | 1 | 0 |
| 3 | 1 | 0 |
| 4 | 1 | 0 |
| Uncoated | 4 | 3 |

Rating:
0 - samples spontaneously fell apart
1 - samles peeled apart with no damage
2 - samples peeled apart with slight (<2%) damage to coating
3 - samples peeled apart with significant (2-50%) damage to coating
4 - samples peeled apart with 50% damage to coating
5 - samples could not by peeled apart

SLIDE ANGLES

| Example | Photopolymer | Polyethylene Oxide |
|---|---|---|
| 1 | 13 | 29 |
| 2 | 28 | 26 |
| 3 | 13 | 21 |
| 4 | 14 | 20 |
| Uncoated | 28 | 58 |

The results show that the polyethylene oxide release layer does not block to the backside of the polyester film coated with the cross-linked polyolefin coating. The polyolefin backcoating also prevents blocking of the unphotopolymerized polymer forming the image to the adjacent layer of polyester film. Finally, the polyolefin backcoating gives much better slip properties between the photopolymer image and the adjacent polyester film.

EXAMPLE 5

This example illustrates the use of polyethylene terephthalate film bearing a non-blocking layer of this invention to prepare a non-blocking, precolored, four-color, positive overlay proof substantially as described in coassigned U.S. application Ser. No. 357,849.

"Coating solution" refers to the mixture of solvent and additives which is coated, even though some of the additives may be in suspension rather than in solution, and that "total solids" refers to the total amount of nonvolatile material in the coating solution even though some of the additives may be nonvolatile liquids at ambient temperature.

GLOSSARY

| | |
|---|---|
| Carboset ® 525 | Poly(ethyl acrylate/methyl methacrylate/acrylic acid) 56.6/37.6/7 copolymer; B. F. Goodrich |
| o-Cl-HABI | 1,1'-Biimidazole, 2,2'-bis[o-chlorophenyl]-4,4',5,5'-tetraphenyl-; CAS 1707-68-2 |
| Cyan pigment | Monastral Blue G (BT 284D); C.I. No. Pigment Blue 15; copper phthalocyanine |
| Elvacite ® 2051 | Poly(methyl methacrylate); MW 350,000 Du Pont |
| Goodrite ® K-732 | 49.5% of polyacrylic acid in water, MW 5,100; B. F. Goodrich |
| Hetron ® 912 | Epoxy acrylate resin; Ashland Chemical |
| Kraton ® D1107 | Styrene-isoprene-styrene block copolymer; Shell Chemical Corp. |
| Magenta pigment | Quindo Magenta RV 6803; Harmon |
| 2-MBO | 2-Mercaptobenzoxazole; 2-Benzoxazole-thiol; CAS 2382-96-9 |
| Methacrylate | Elveron ® 6037; Poly(methyl-dispersant methacrylate/2-ethylhexyl acrylate - Desmdur ® adduct; MW 9,000 |
| Pluronic ® L92 | Octylphenyl ethylene oxide; BASF Corp. |
| Polyox ® WSRN 3000 | Polyethylene oxide; MW 400,000; Union Carbide |
| PVP K-90 | Polyvinylpyrrolidone, MW 350,000; GAF Corp. |
| Raven ® 450 | Carbon black, C.I. No. Pigment Black 7; Cities Service Co. |
| Raven ® 1035 | Carbon black, C.I. No. Pigment Black 7; Cities Service Co. |
| Scarlet Pigment | Indofast ® Brilliant Scarlet R6300; C.I. No. Pigment Red 123 |
| Tinopal ® SFG | 3-Phenyl-7-[2'-(4'-N,N-diethylamino-6'-chloro-1',3',5'-triazinylamino]-coumarin; Ciba-Geigy |
| Yellow Pigment | Cromophtal ® Yellow 3G; C.I. No. Pigment Yellow 93; Ciba-Geigy |
| Zonyl ® FSN | Nonionic fluorosurfactant; E. I. Du Pont de Nemours anc Co.; CAS 65545-80-4 |

The compositions of the colored chips used for the precolored photopolymerizble layers are given in Table 1.

TABLE 1[a]

| | Yellow | Magenta | Cyan | Black |
|---|---|---|---|---|
| Yellow Pigment | 40 | | | |
| Magenta Pigment | | 31.59 | | |
| Scarlet Pigment | | 8.94 | | |
| Cyan Pigment | | | 30 | |
| Raven ® 450 | | | | 20 |
| Raven ® 1035 | | | | 20 |
| Methacrylate dispersant | 10 | 20.53 | 10 | 20 |
| Elvacite ® 2051 | 50 | 38.94 | 60 | 40 |

[a]Ingredients given in percent by weight.

Step 1 Coversheet and Photorelease Layer

To prepare the photorelease layer a solution of: Polyox ® WSRN-3000(87.0% by weight of total solids), PVP K-90 (2.7%), Goodrite ® K-732 (10.3%), and Pluronic ® L92 (0.1%) in water (99.2% water; 0.8% total solids; viscosity, 12 cps in Brookfield viscosity with spindle #2) was coated onto the coversheet, a clear 2 mil (50 micron) polyethylene terephthalate film bearing a non-blocking layer prepared as described in Example 1. The photorelease coating was coated onto the side of the coversheet which did not bear the anti-blocking layer to produce an element consisting of: anti-blocking layer, coversheet, and photorelease layer. The solution was coated with an extrusion die at a coating rate of 40 ft/min (20 cm/sec). The solvent was evaporated by passing the coated film through a three zone drier. The coating weight was 1.3 mg/dm2. The photorelease layer was not protected by a release film after coating.

Step 2 Coating solution for the Precolored Photopolymerizable Layer

The coating solution for the magenta precolored photopolymerizable layer was prepared by adding the ingredients shown in the magenta column of Table 2 to methylene chloride. The monomer and binder, Hetron ® 912 and Elvacite ® 2051, were added and dissolved first, followed by the colored chips, and then all the other ingredients. All solutions were prepared under yellow light. An amount of methylene chloride was used to produce a coating solution that was 77% by weight methylene chloride and 23% by weight total solids.

TABLE 2[a]

|  | Yellow | Magenta | Cyan | Black |
|---|---|---|---|---|
| Yellow Chips | 25.00 | — | — | — |
| Magenta Chips | — | 24.50 | — | — |
| Cyan Chips | — | — | 16.20 | — |
| Black Chips | — | — | — | 30.00 |
| Hetron ® 912 | 53.50 | 53.50 | 53.50 | 53.50 |
| Evacite ® 2051 | 15.40 | 15.90 | 24.20 | 10.40 |
| Carboset ® 525 | 2.00 | 2.00 | 2.00 | 2.00 |
| Polyox ® WSRN-3000 | 0.60 | 0.60 | 0.60 | 0.60 |
| Tinopal ® SFG | 1.00 | 1.00 | 1.00 | 1.00 |
| o-Cl HABI | 1.50 | 1.50 | 1.50 | 1.50 |
| 2-MBO | 1.00 | 1.00 | 1.00 | 1.00 |
| Zonyl ® FSN | 0.01 | 0.01 | 0.01 | 0.01 |

[a]Ingredients are in weight percent.

Step 3 Precolored Photosensitive Element

To prepare the elastomeric layer a solution of Kraton ® D1107 in methylene chloride (16% by weight Kraton ® D1107) was prepared. The coating solution for the magenta precolored photopolymerizable layer prepared in Step 2 and the solution of Kraton ® D1107 were simultaneously coated onto the photorelease layer of the element prepared in Step 1 using a dual slot die. The coating speed was 50 ft/min (25 cm/sec). Coating weights were 36 mg/dm2 for the precolored photopolymerizable layer and 110 mg/dm2 for the elastomeric layer.

A 3 mil (75 micron) hazy polyethylene terephthalate support was pressure laminated to the elastomeric layer as it emerged from the drier to produce an element with the following structure: anti-blocking layer; 2 mil (50 micron) clear, polyethylene terephthalate coversheet; photorelease layer; magenta precolored photopolymerizable layer; elasto-meric layer; and 3 mil (75 micron) hazy polyethylene terephthalate support.

Step 4 Image Preparation

The magenta precolored photosensitive element produced in Step 3 was placed in a vacuum frame with the anti-blocking layer up (i.e., facing the light source). A magenta half-tone positive separation transparency was placed on top of the anti-blocking layer with the emulsion side in contact with the anti-blocking layer and a vacuum drawn before exposure. Irradiation was carried out through the separation transparency, anti-blocking layer, and coversheet. The sample was exposed for 30 sec with a 5 kw high pressure mercury vapor lamp (Violux ® 5002S, Exposure Systems Company, Bridgeport, Conn., equipped with a photopolymer bulb) about 54 inches (about 137 cm) above the sample and integrator. The sample was removed from the vacuum frame and placed on a vacuum easel. The cover-sheet was removed by peeling back at 180° ("peel-back mode") in a smooth, continuous motion at a rate of about 800 ft/min (400 cm/sec). The areas which were not exposed adhered to the coversheet to form an overlay image which is a positive of the separation transparency used for exposure to produce a magenta, positive overlay image consisting of: anti-blocking layer, coversheet, and the imaged precolored photopolymerizable layer.

Step 5 Four color Overlay Proof

To produce the yellow, cyan, and black positive overlay images, the procedure of Steps 2–4 was followed with the exception that the ingredients shown in the yellow, cyan, and black columns of Table 2 were each, respectively, added to methylene chloride in place of the ingredients shown in the magenta column of Table 2 and that the coating solution for the black precolored photopolymerizable layer was 27% by weight total solids and 73% methylene chloride. After exposure of each of the precolored, photosensitive elements through its corresponding separation transparency followed by peeling apart, yellow, cyan, and black positive overlay images were produced.

To produce the precolored, four color, overlay proof, the yellow, magenta, cyan, and black images, in order from bottom to top, were stacked in register. The side of the coversheet containing the imaged precolored photopolymerizable layer was down (i.e., away from the observer) and the anti-blocking layer was up (i.e., facing the observer) for each image.

The precolored, four color, overlay proof (about 12 in. × 20 in.; 30.5 cm × 50.8 cm) was weighted with 265 gm and stored in an oven at 40° C. and 70% relative humidity. No blocking was observed after 21 days of storage. Under these conditions, severe blocking was observed after only about 3 days with a similar overlay proof in which the coversheet did not have an anti-blocking layer.

What is claimed is:

1. A multilayer, peel-apart photosensitive element comprising, in sequence:
   (1) a strippable coversheet, transparent to actinic radiation, and coated on a surface with a layer of a cross-linked polyolefin homopolymer, cross-linked polyolefin homopolymer which has been oxidatively modified to introduce acid groups, or cross-linked polyolefin copolymer formed by copolymerization of a polyolefin with up to 5 weight % of a copolymerizable monomer, wherein the coated surface does not face a photohardable layer of (2)
   (2) a photohardenable layer,
   (3) a non-photosensitive elastomeric layer; and
   (4) a support sheet.

2. The element of claim 1 which contains a photorelease layer between the cover sheet and the photohardenable layer.

3. The element of claim 2 between the cover sheet and photohardenable layer wherein the photorelease layer comprises a solid, oxyethylene homopolymer photorelease agent of the formula, $H(OCH_2CH_2)_nOH$, with being an integer sufficient to provide the homopolymer with a molecular weight of at least 2,000.

4. The element of claim 3 wherein the cross-linked polyolefin is derived from an unsaturated aliphatic hydrocarbon.

5. The element of claim 4 wherein the cross-linked polyolefin has an acid number ranging from 10 to 50.

6. The element of claim 5 wherein the cross-linked polyolefin is polyethylene or polypropylene.

7. The element of claim 1 wherein the cross-linked polyolefin is derived from an unsaturated aliphatic hydrocarbon.

8. The element of claim 7 wherein the cross-linked polyolefin has a molecular weight of at least 2000 and an acid number ranging from 10 to 50.

9. The element of claim 8 wherein the cross-linked polyolefin is polyethylene or polypropylene.

* * * * *